United States Patent [19]
Dolan et al.

[11] Patent Number: 5,977,724
[45] Date of Patent: Nov. 2, 1999

[54] BULB ROTATION FOR ELIMINATING PARTIAL DISCHARGES

[75] Inventors: James T. Dolan, Frederick; Charles H. Wood, Rockville; Michael G. Ury, Bethseda, all of Md.

[73] Assignee: Fusion Lighting, Inc., Rockville, Md.

[21] Appl. No.: 08/811,466

[22] Filed: Mar. 3, 1997

Related U.S. Application Data

[63] Continuation of application No. 08/176,273, Dec. 30, 1993, abandoned, which is a continuation-in-part of application No. 08/071,027, Jun. 3, 1993, Pat. No. 5,404,076, which is a continuation of application No. 07/604,487, Oct. 25, 1990, abandoned, and a continuation-in-part of application No. 07/953,056, Sep. 30, 1992, abandoned, and application No. 07/976,938, Nov. 18, 1992, abandoned, which is a continuation-in-part of application No. 07/805,563, Dec. 13, 1991, abandoned.

[51] Int. Cl.$^6$ .................................................. H05B 37/02
[52] U.S. Cl. ............................................................ 315/248
[58] Field of Search ............................. 310/248; 315/344

Primary Examiner—Robert Pascal
Assistant Examiner—Michael Shingleton
Attorney, Agent, or Firm—Pollock, Vande Sande, & Amernick, R.L.L.P.

[57] ABSTRACT

The envelope of an electrodeless lamp which would tend to produce a discharge which does not substantially fill the interior of the envelope if the envelope is not rotated or is rotated at insufficient speed, is rotated at a high enough speed to cause the discharge to substantially fill the interior of the envelope.

12 Claims, 3 Drawing Sheets

BULB ROTATION FOR ELIMINATING PARTIAL DISCHARGES

CROSS-REFERENCES TO RELATED APPLICATIONS

This application is a continuation of U.S. application Ser. No. 08/176,273, filed Dec. 30, 1993 now abandoned which is a continuation-in-part of U.S. application Ser. No. 08/071,027, filed Jun. 30, 1993, now U.S. Pat. No. 5,404,076, which is a continuation-in-part of U.S. application Ser. No. 07/953,056, filed Sep. 30, 1992 now abandoned and U.S. application Ser. No. 07/976,938, filed Nov. 18, 1992 now abandoned which is a continuation-in-part of U.S. application Ser. No. 07/805,563 now abandoned. Said 08/071,027 application is a continuation of U.S. application Ser. No. 07/604,487 filed Oct. 25, 1990, now abandoned.

BACKGROUND OF THE INVENTION

1. Field of the Invention

The present invention relates to improving the operation of electrodeless lamps.

2. Description of Related Prior Art

Under certain circumstances, electrodeless lamps will produce a discharge which is present only in a portion or portions of the bulb interior rather than being distributed substantially throughout the bulb volume.

One example of such a situation is where an electrodeless lamp having a fill wherein sulfur or selenium or compounds of these elements is the primary radiating component, utilizes a relatively small bulb.

Electrodeless lamps which utilize sulfur and selenium based fills are disclosed in co-pending application Ser. No. 071,027, filed Jun. 30, 1993, now U.S. Pat. No. 5,404,076 and application Ser. No. 604,487, filed Oct. 25, 1990, which are incorporated herein by reference. Such a lamp, at least in certain implementations relies on molecular radiation as the dominant source and is able to provide radiation principally within the visible range. Additionally, it is sometimes desirable to use small bulbs in such lamps, for example of less than ½" diameter in cases where a bright light source is needed. One such application is in LCD type projection television systems, where the necessity that the source approximate a so-called point light source dictates that the source be no more than about ¼" inside diameter (ID).

U.S. Pat. No. 4,887,192, assigned in common with the present application, discloses microwave cavities for coupling to small bulbs, i.e., less than ½ inch, and is incorporated by reference herein.

However, it was found that when a bulb having a sulfur fill (including argon as a starting gas) of about ¼" inch ID is installed in a cavity as disclosed in U.S. Pat. No. 4,887,192, successful operation is not achieved. Rather, a discharge which is isolated and floats near the top of the bulb is observed, and the spectrum which is outputted by the floating discharge is different than what is expected.

When an electrodeless lamp is excited with a coaxial termination fixture, an isolated discharge region may occur in the bulb at a position near the center conductor of the coaxial fixture, where the field is strongest. This leads to a phenomenon known as "arc attachment" wherein rupture of the bulb occurs at a position near the center conductor of the coaxial fixture.

A further problem in the operation of electrodeless lamps, and particularly those which emit visible light is that a "wobble" or "flicker" effect may be present. As used herein, the term "wobble" means any movement in the projected light which is observed by the viewer. This movement may be distracting to the viewer of the projected image, or even cause eye fatigue.

A reason for the wobble effect is that the bulb or envelope is itself visually imperfect and is rotated during operation. Thus, the envelope may have a perturbation, for example, an eccentricity, which would mean that the bulb is slightly out of round if, in the particular embodiment, it is a spherical envelope. The envelope in electrodeless lamps may be rotated while cooling fluid (e.g., compressed air) is directed at it to improve cooling, which allows the lamp to be operated at increased power densities, for example, see U.S. Pat. No. 4,485,332. It is the rotation of an envelope having a perturbation which results in the visual wobble or flicker when the bulb is rotated at the usual speed for cooling purposes of about 300 RPM.

U.S. Pat. No. 4,954,756 teaches to rotate bulbs at speed sufficient to equalize the thin boundary layer near the bulb wall by the application of centrifugal forces on the fill. For example at column 4, line 30 of that patent, it is stated that for bulbs of from 0.75 to 1.5 inch diameters rotation rates in the range of from 1500 to 2500 RPM may be used. It should be noted that between the low speed state and the high speed rotated state there is not a significant change in the spectral energy distribution of the bulb, although there is a change in the directional power distribution. The boundary layer effect described in U.S. Pat. No. 4,954,756 is different than the effect which is described herein, as in the boundary layer effect the discharge is distributed substantially throughout the interior of the envelope, but only is not present at the boundary layer, (which typically comprises about 5 to 20% of the total bulb volume). Such a boundary layer is typical in electrodeless lamps of the type described herein, and will exist even in lamps operated in accordance with the teachings of the present invention, wherein the discharge substantially fills the interior of the envelope. Moreover, since the redistribution effect in U.S. Pat. No. 4,954,756 is related to the centrifugal forces on the bulb, a rotation speed of at least 4500 RPM would be dictated for one-quarter inch ID bulbs in order to see this effect.

SUMMARY OF THE INVENTION

In accordance with a first aspect of the present invention, the envelope of an electrodeless lamp which would tend to produce a discharge which does not substantially fill the interior of the envelope if the envelope is not rotated or is rotated at insufficient speed, is rotated at a high enough speed to cause the discharge to substantially fill the interior of the envelope.

In accordance with a further aspect of the present invention, an electrodeless lamp having a fill including sulfur or selenium which would tend to produce a discharge which does not substantially fill the interior of the envelope if the envelope is not rotated or is rotated at a speed which is too low, is rotated at a high enough speed to cause the discharge to substantially fill the interior of the envelope.

In accordance with a further aspect of the invention, an electrodeless lamp is rotated in a manner to avoid arc attachment.

In accordance with a still further aspect of the invention, the starting of an electrodeless lamp is facilitated, in that the lamp is enabled to successfully enter an efficient, steady state mode of operation.

In accordance with a still further aspect of the invention a visually imperfect envelope in an electrodeless lamp, such as an envelope having an eccentricity, is rotated at a fast enough rate to eliminate the above-mentioned wobble effect.

The invention will be better understood by referring to the accompanying drawings, wherein:

DESCRIPTION OF PREFERRED EMBODIMENTS

Figure 1A:
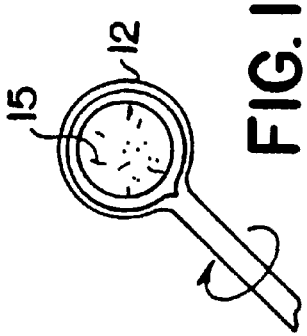
FIG. 1a shows an electrodeless lamp bulb in an inefficient mode of operation.

Referring to FIG. 1a, an electrodeless lamp bulb 12 is depicted. This lamp bulb is part of an electrodeless lamp (not shown), which as known to those skilled in the art may be powered by microwave or R.F. energy. Many different structures are possible for the electrodeless lamp.

To effect more efficient cooling of the bulb, it is known to rotate the bulb about an axis which is defined by the bulb stem while one or more streams of cooling fluid such as compressed air is directed at the bulb. In the prior art, the bulb is typically rotated at 300 RPM to effect such cooling.

In certain electrodeless lamp arrangements, depending on factors including bulb excitation, bulb fill, and bulb size, a discharge which is isolated from the bulb wall may result, an example of which is depicted by reference numeral 14 in FIG. 1a.

The discharge does not substantially fill the interior volume of the bulb or envelope, and the lamp consequently operates with low efficiency. In the example shown in FIG. 1a, it is noted that the lamp has failed to enter an efficient, steady state operating mode, in that fill material remains deposited on the bulb wall, and the fill has not attained proper operating pressure.

It has been discovered that when the bulb is rotated at sufficient speed, the discharge changes so that it substantially fills the interior volume of the bulb. Additionally, the efficiency of the lamp improves as well as the characteristics of the discharge.

Figure 1B:
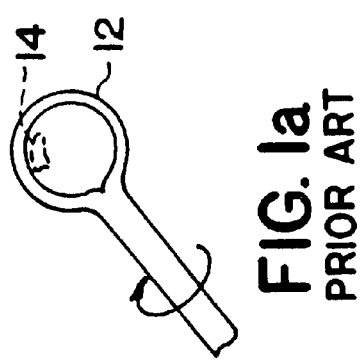
FIG. 1b shows an electrodeless lamp bulb in a desirable mode of operation.

The threshold speed at which the discharge begins to substantially fill the interior volume of the bulb will vary with the specific lamp. Additionally, there may be a range of rotation rates within which either the discharge state depicted in FIG. 1a or that depicted in FIG. 1b or some discharge state in between the two may occur, so the bulb should normally be rotated at a speed above this range where only the discharge state which is depicted in FIG. 1b may occur. It is noted that the region in FIG. 1b between the discharge and the bulb wall, is the boundary layer.

Figure 2:
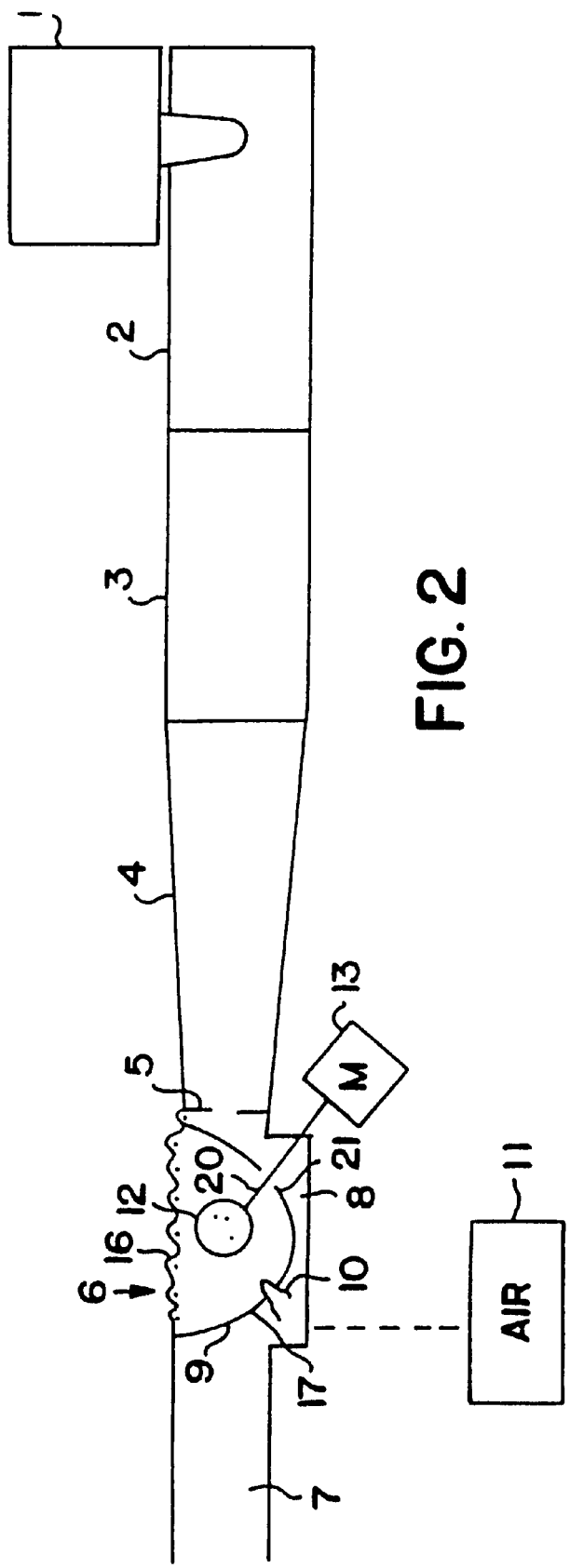
FIG. 2 shows an electrodeless lamp according to one embodiment of the present invention.

Referring to FIG. 2, an embodiment of the present invention which depicts a lamp which is powered by microwave energy is shown. Beginning the description at the right side of the figure, a magnetron 1 is coupled to a first section of waveguide 2. These components are arranged so that a TE01 microwave mode is launched in the waveguide with a vertical electric field orientation. The waveguide is connected to a circulator 3 fitted with a dissipative load such as a block of silicon carbide. The circulator is in turn connected to the large end of a tapered waveguide section 4. At the far, smaller end of the tapered waveguide is a coupling iris plate 5. Beyond the coupling iris is a cavity 6 as taught in U.S. Pat. No. 4,887,192 including a vestibule section 7 and a reflector 9. The reflector includes a wire mesh portion 16 on the top side. This embodiment differs from the embodiments shown in U.S. Pat. No. 4,887,192 in that the reflector protrudes from the bottom rather than the top of the vestibule section.

A bulb 12 is supported by its stem 14 at a 60 degree angle with respect to the electric field i.e., the vertical in the drawing. This is in accordance with the teachings of U.S. Pat. No. 4,902,935 to Wood et al. The bulb is rotated at high speed about an axis concentric with its stem by a motor which is coupled to the stem.

In a particular embodiment as shown, the bulb has a spherical envelope of 9.5 mm ID. The bulb contained a fill of 1.8 milligrams of sulfur and 60 torr of argon. In this embodiment, the threshold angular velocity is 2000 RPM. Below 1500 RPM an isolated discharge as shown in FIG. 1a occurs, while above 2000 RPM it does not. Between 1500 and 2000, either may occur so the bulb should preferably be rotated above 2000 RPM in order to rule out operation in the undesirable mode.

Referring once again to FIG. 2, a dielectric reflector 9 is fitted in the cavity to improve the collection efficiency of the optics. The reflector may be in the shape of an ellipsoid or paraboloid if the lamp is to be used with an LCD projection system. The reflector may be in the shape of an ellipsoid if the lamp is to be used with a film gate type projection system such as a movie projection system.

The bulb stem fits through a hole 15 in the reflector 9. A pressurized air nozzle 10 directs a jet of impinging air at the bulb 12. The air jet fits through a hole 16 in the reflector 9. The air jet is connected to a source of compressed air 11 such as a compressor.

In accordance with a further aspect of the present invention, the isolated discharge which is obviated is of the type which would cause "arc attachment" to occur.

For many applications, it is desirable to provide a small bright source, which dictates a small discharge envelope. Examples of such applications are automobile headlights, LCD or similar electro-optic projection systems, and photolithography sources.

U.S. Pat. No. 4,975,625 to Lynch et al and U.S. Pat. No. 4,877,192 to Simpson et al., teach microwave lamps with resonant cavities which subject relatively small discharge bulbs to high intensity fields. However when attempting to couple to even smaller bulbs (e.g., inside diameters of 5 to 8 mm,) the resistive losses in the cavity increase, but also the overall Q of the lamps increases, which leads to frequency instabilities when using commercial magnetron sources.

Microwave coaxial electrodeless lamp fixtures, exemplary of which are those taught in U.S. Pat. No. 3,993,927 to Haugsjaa et al., U.S. Pat. No. 4,223,250 to Kramaer et al. and U.S. Pat. No. 4,605,701 to Haugsjaa et al. are known from the prior art. Coaxial lamp fixtures generally comprise an inner conductor located close to the discharge bulb and a grounded or opposite polarity structure further, perhaps surrounding or across from the bulb. These fixtures suffer from the problem that the high field and discharge intensity in the bulb next to the inner conductor causes the formation of a localized field region of much higher energy density than the surrounding region which attaches to the inside of the wall of the discharge envelope. This quickly melts the bulb, and causes rupture thereof within seconds or minutes. This phenomenon is commonly referred to as arc attachment.

The problem of arc attachment failure is addressed in U.S. Pat. No. 3,942,058 to Haugsjaa et al and U.S. Pat. No. 4,178,534 to McNeil et al. Presented in both patents is the equation Pe−Ph=Pr wherein Pe is defined as the power gained by the electrical excitation, Ph is power lost as heat and Pr is the power of radiated emissions, as well as a second equation $Pe=n_e uE^2$, where $n_e$ is the electron density, u is the electron mobility, and E is the electric field strength. This equation relates the coupled power density to the electric field in a way analogous to an ohmic heating relation. The two patents suggest excitation structure designed to reduce the electric field intensity near the inside of the walls of the discharge envelope so that Pe drops to the point that no radiating discharge occurs near the walls of the envelope and thereby formation of arcs attached to the inside of the discharge wall envelopes is prevented.

Coaxial fixtures are compact, which is often desirable. However as the size of the bulb is reduced in an effort to produce a small, bright, source, with the operation wavelength remaining fixed at a practical ISM wavelength, the method suggested by the above-noted patents cannot be implemented because it is difficult to create variation of the discharge intensity over the volume of the bulb such that the discharge is isolated from the walls. Moreover, from an optical standpoint, it is undesirable to have a source which is spatially non-uniform. In attempting to develop microwave lamps with small bulbs, the inventors were confronted with the high field strength requirement for coupling high power densities to small bright bulbs. The common wisdom in the art holds that the problem of arc attachments would be exacerbated in the case of such high power density, high field intensity bulbs.

According to an aspect of the invention, the bulb of an electrodeless lamp is rotated to overcome the problem of arc attachment. An electrodeless lamp is provided wherein the electromagnetic energy pattern set up proximate the bulb wall is capable of causing arc attachment in the bulb. The bulb is rotated so as to cause regions of the bulb corresponding to regions of the electromagnetic field pattern where arcs are formed to be constantly moving under rotation. It has been discovered that the movement tends to eliminate the arc attachment failure mechanism. It is speculated that arcs may be forming near the high field region, but that rotation away from the high field region at sufficient speed prevents the arcs from enduring.

This invention is, in one particular case, applicable to coaxial lamps in which the discharge envelope is positioned near a conductive excitation member which creates high strength fields in at least one part of the volume occupied by the discharge envelope which makes the lamp prone to arc attachment problems. The rotation axis is preferably arranged so that no spot on the bulb wall which comes near the high field region (the region close to the conductive member) of the bulb remains there, but rather so it rotates away. In fact, it is possible with this invention to create conditions that would ordinarily exacerbate the problem of arc attachment, but are desirable from design standpoint: that is high power loaded, small bulbs, without incurring arc attachment problems.

According to an embodiment of this invention which will be detailed below, a coaxial lamp comprises an inner conductor which creates a high field region near the bulb. The bulb is rotated about an axis which is non-parallel and which is preferably near normal to the inner conductor, such that the bulb is excited uniformly at a high density so as to achieve a uniform bright source, with the result that arc attachment is avoided.

Figure 3:
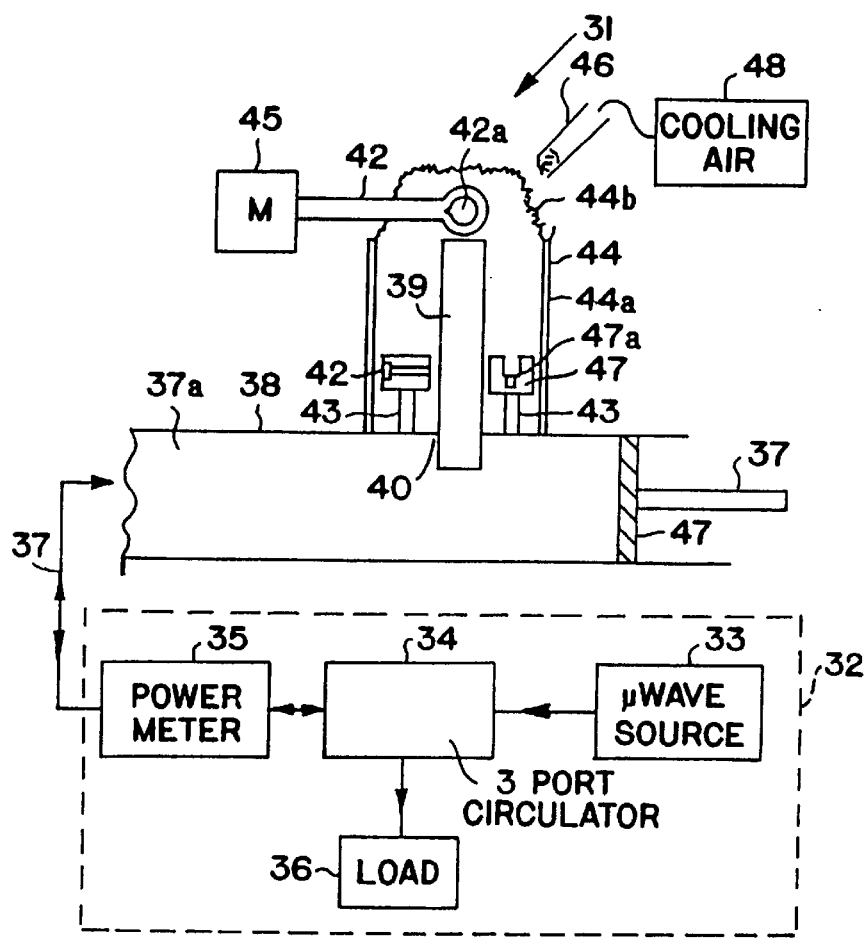
FIGS. 3 and 4 show electrodeless lamps according to further embodiments of the present invention.

Referring to FIG. 3, the lamp fixture generally designated by 31 is fed power from an experimental set up power system generally designated by reference numeral 32.

The power system is configured as follows. A microwave power source 33 such as a commercial microwave oven magnetron produces from several tens to several hundreds of watts of microwave power preferably at the ISM frequency of 2.45 Ghz. The source 33 is coupled to a three port circulator 34 which isolates the source 33 from nonabsorbed power that is reflected from the fixture 31. The circulator is connected to a power meter 35 which measures forward and reflected power and a dissipative load 36 which absorbs reflected power. Power flows through the power meter 35 to the section of waveguide 37a which is connected to fixture 31. All connection lines designated by reference numerals 37, 37a represent rectangular waveguide. The dissapitive load 36 is connected directly to the circulator 34. In a production design, the power system 32 would typically be simplified by eliminating the power meter 35, circulator 34, and dissipative load 36, as in the case of the embodiment of FIG. 4 described below.

Continuing with the description of FIG. 3, the fixture 31 is mounted on the centerline of the top broadside 38 of rectangular waveguide 37a. The rectangular waveguide, 37, 37a is sized to propagate the TE10 microwave mode, so that the electric field is polarized normal to the broadside walls of the waveguide 37a. A hollow, tubular inner conductor member 39 is arranged normal to and inserted in a hole 40 on the centerline of top broadside 38. The hole is slightly larger than the inner conductor 39 so as to provide insulating gap spacing between the inner conductor 39 and the broadside wall 38. The inner conductor is supported by a teflon washer 41 on top of the broad side wall 38, to which it is secured by a nylon set screw 42. The teflon washer 41 is in turn supported by two teflon standoffs 43, 43' to which it is secured by two metal screws (one of which is shown) 41a. The metal screws 41a are countersunk into the teflon washer to prevent arcing to them. The standoffs 43,43' are provided to locate the washer 41 in a region of low electric field in the fixture 31 so that it does not interfere with, or absorb the microwave signal. The top of the inner conductor is positioned near the spherical bulb envelope 42a of the discharge bulb 42. The length of the inner conductor may be selected to achieve resonance. The lower end of the inner conductor extends downward through about ⅙ of the height of the waveguide. This penetration is selected for good coupling between the fixture and the guide 37a. Concentric with and to the outside of the inner conductor 39, hole 40, and washer 41 and also mounted on top broadside wall is the outer conductor 44. The outer conductor 44 comprises a solid cylindrical wall portion 44a which extends up from the top broadside wall 38, and a capped truncated cone shaped mesh portion 44b attached to the top of the cylindrical section 44a closes the chamber formed by the outer conductor 44. The stem of the bulb 42 extends through the mesh portion 44b to the outside of the outer conductor 44, where it is attached to the shaft of an electric motor 45, which is itself supported by a simple support frame not shown in the figure. The stem of the bulb 42 may be normal to the inner conductor 39.

A cooling jet 46 directs air from a cooling air source 48 such as a compressor through the mesh 44b at the bulb envelope 42a. The cooling jet may be positioned so as to direct air normal to both the bulb stem 42 and the inner conductor 39, so that, in other words, the three elements may be mutually perpendicular.

A sliding short 47 is provided in the end of the waveguide 37a for experimental tuning purposes.

In a model built as shown in FIG. 1, the frequency of operation was 2.45 GHz. The waveguide 37a used was type WR284. The inner conductor was 0.030 inch O.D., 1.900 inch long and extended 0.270 inch into the waveguide. The solid section 44a of the outer conductor was 1.00 inch I.D. and 1.270 inch tall. The mesh section 44b had a lower base diameter of 1.100 inch and upper base diameter of 0.500 inch and a height of 0.90 inch. The bulb was rotated at 3000 RPM, which speed was found to be adequate to avoid arc attachment. The bulb 42a envelope was spherical with a 6.5 MM ID, a volume of 0.144 cubic centimeters and a 0.5 MM wall thickness. The bulb envelope 42a was located 0.030" from a plane across the top of the inner conductor. The bulb envelope 42a contained a fill of approximately 1 milligram of sulphur and 60 torr of argon. 15 PSI of cooling air was supplied to the cooling jet 16 which had a 0.050 inch orifice. The power output of the magnetron was 200 to 300 watts.

It is noted that in embodiments which are cooled with one or more streams of cooling fluid, rotation at high speeds has the additional advantage of improving bulb lifetime, in that cyclical temperature stress is minimized because the change in temperature experienced by any spot on the bulb as the bulb rotates around the cooling stream is lowered.

Figure 4:
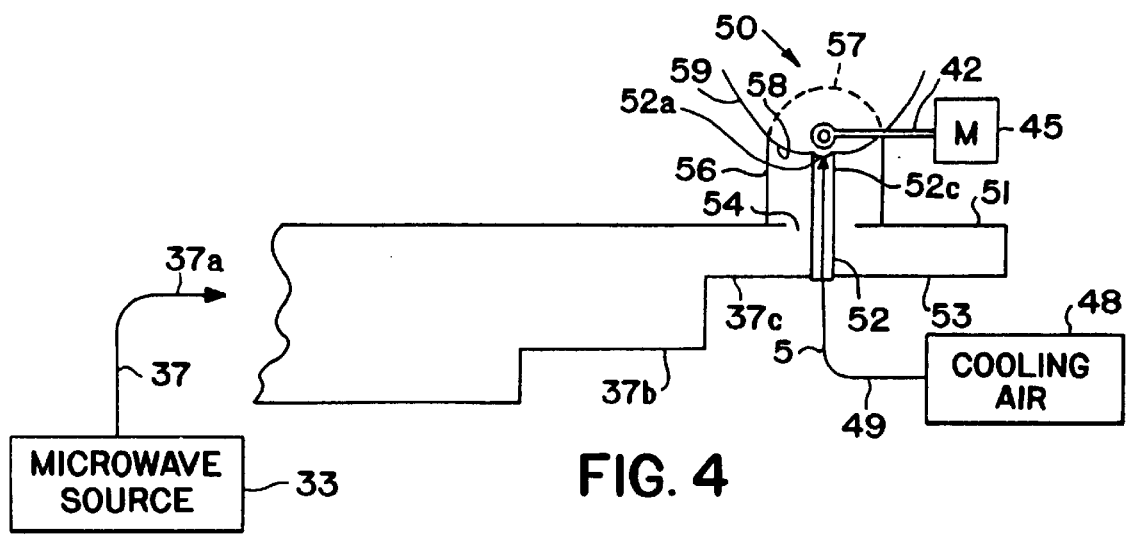

Referring to FIG. 4, a second embodiment of the invention is shown. Elements corresponding to those shown in FIG. 3 are designated with the same reference numerals. A microwave source 33 feeds through waveguide sections 37, 37a. The waveguide section 37a is connected to a stepped section 37b which comprises two steps in the height of the waveguide connected to low height section of waveguide 37c. The steps serve as an impedance transformer to partially match the impedance of the waveguide 37,37a to that of the fixture 50 which is mounted on the top broadside 51 of the low height waveguide section 37c. The inner conductor 52 is mounted on the lower broad wall 53 of the reduced height waveguide section 37c, and extends upwards through a hole 54 in the upper broad wall 51. The hole is large enough to provide insulating gap clearance. The top 52a of the inner conductor 52 is located proximate the end of the bulb, typically from a fraction to a few thousandths of an inch. In the embodiment shown, the top 52a of the inner conductor 52 is a spherical surface centered on the bulb. The uniform gap formed between the top 52a of the inner conductor 52 and the bulb provides for more uniform power loading of the bulb 42 surface near the inner conductor 52.

Cooling air is fed from source 48 through line 49 to the bottom of the inner conductor 52 at the lower broad wall 53, through a passage 52b up the length of the inner conductor 52b to one or more cooling air jet orifices 52c in the top surface 52a and is jetted against the bulb 52. The outer conductor comprises a cylindrical wall 56 connected to the upper broad wall 51 and is about as high as the inner conductor 52 and a hemispherical mesh portion 57 joining the cylindrical wall. The mesh 57 serves to contain the excitation energy while transmitting the output of the bulb. Located around the bulb inside the mesh is a dielectric reflector 58. Located around the bulb outside the mesh is a metal reflector 59. The contour of the inner reflector 58 is continuous with the contour of the outer reflector 59.

The stem of the bulb 42 extends through a hole in the mesh 57 to a motor 45, which serves to rotate the bulb during operation at a speed which prevents arc attachment in the bulb. The bulb is arranged so that parts of the bulb which come near the high field intensity region near the end 52a of the inner conductor 52 do not remain there but are constantly rotated around.

Tests conducted by the inventors showed that if the bulb is rotated about an axis parallel to the inner conductor 52 so that regions of the bulb remain in the vicinity of the inner conductor 52 end 52a arc attachment and bulb failure occurs within seconds.

Figure 5:
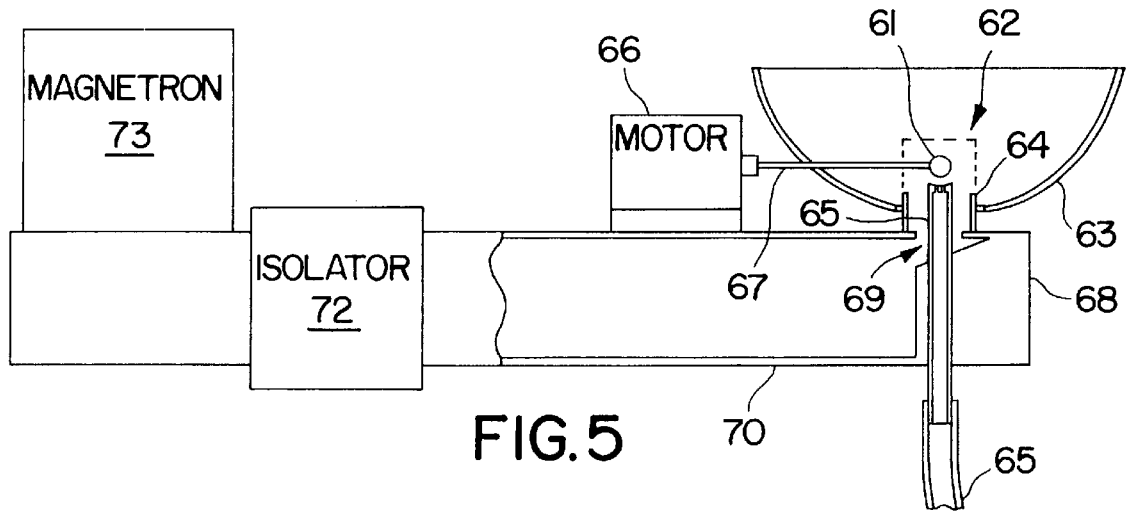
FIGS. 5, 6, and 7 show an electrodeless lamp according to a still further embodiment of the present invention.

Referring to FIG. 5, a further embodiment of the invention is depicted. A light source is shown which is suitable for generating a high intensity white light, especially for use in projection television applications. The electrodeless lamp 61 is excited by microwave electromagnetic energy which exits a coaxial transmission line structure 62 having a center conductor 65 and an outer conductor 64. The coaxial transmission line structure is coupled to a waveguide 70. The waveguide 70 is in turn connected through an isolator 72 to a magnetron 73.

Light from the electrodeless lamp 61 passes through the transparent outer conductor structure 64 which may be a cylindrically-formed wire mesh, and is incident to a reflector 63. The reflector 63 has an aperture co-extensive with the entrance aperture of the optical system of a projection television.

The magnetron 73 has a frequency in the ISM microwave band which is centered at 2450 MHz. An isolator 72 effectively isolates any energy reflected from the waveguide section 70 which may shift the frequency of operation of magnetron 73 away from a nominal frequency. As the waveguide 70 is matched in a particular frequency range to deliver maximum microwave power to the bulb 61, any frequency tolerance associated with the magnetron 73 could result in a reflection sufficiently large being returned from waveguide 70 such that the frequency of the magnetron 73 is pulled from its nominal frequency further increasing the size of the reflection. Increases in reflected energy consequently reduce the amount of energy delivered to a load.

The coupling of electromagnetic energy from the waveguide 70 to the electrodeless lamp 61 is provided by a transmission line structure comprising a center conductor 65 and outer conductor 64. The center conductor 65 passes through an opening in the waveguide 70 into a coupling chamber 69 defined as an alcove formed at the end of the waveguide 70. The section of center conductor 64 which is exposed in the alcove 69 forms a coupling loop. The alcove 69 is shaped to provide for an impedance match between the coaxial transmission line defined by center conductor 65 and outer conductor 64 to the waveguide 70. The waveguide 70 is terminated at the second end by a short 68.

The center conductor 65 is hollow and exits the waveguide through a clearance hole, spaced from the upper wall of the waveguide 70 to avoid arcing therewith. The other end of the center conductor 65 extends through the partition 76, defining the alcove, and exits through the opposite side of the waveguide 70.

The hollow center conductor 65 is connected to a source of compressed air 75 and supplies cooling air to the surface of the electrodeless lamp 61. The microwave circuit, comprising the waveguide 70, alcove 69 and coaxial transmission line 62 couples the magnetron-produced microwave energy to the electrodeless bulb 61, causing it to emit high-intensity white light.

The outer conductor 64 of the coaxial transmission line 62 is transparent to light and, in a preferred embodiment, comprises a mesh conductor, terminating on the upper wall of waveguide 70, extending above the electrodeless lamp 61. The outer conductor 64 mesh extends above the electrodeless lamp 61 to shield significant levels of radio frequency energy from being radiated by the transmission line.

Figure 6:
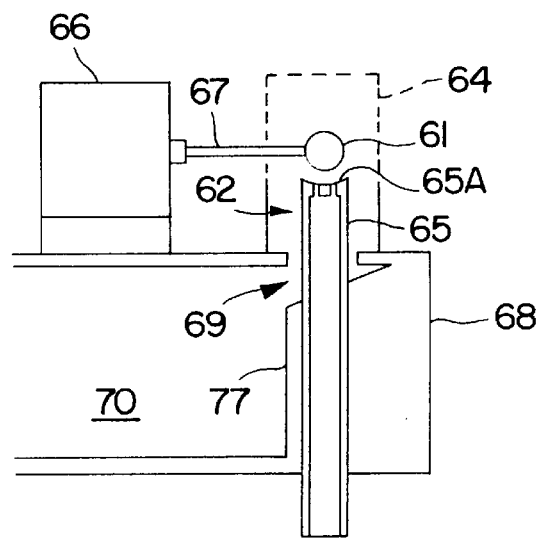
Figure 7:
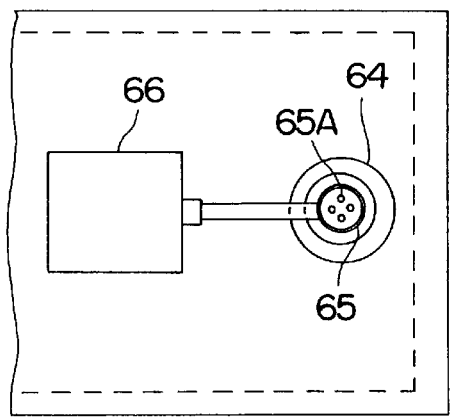

FIG. 6 illustrates in greater detail the structure of the coupling device connecting microwave waveguide 70 and transmission line 62. The alcove 69 is formed by an alcove partition 77 which occludes a major portion of the area of the waveguide 70. The alcove 69, in the preferred embodiment, is shown as a wedge-shaped alcove having an entrance aperture, and which decreases in area in the direction of the short circuited waveguide end 68. An apertured surface is provided on the end of center conductor 65, creating a stream of air for cooling the electrodeless lamp 61. The apertured surface is curved and has a center of curvature common to the electrodeless lamp 61 center of curvature. This provides a constant distance between the end of the center conductor and the surface of electrodeless lamp 61.

Since there is little RF electric field in the alcove 69, the RF magnetic field filling the space is constant, and equal to the value of the field tangent to the end of the waveguide 70. The coupling loop, excited by this field, is bounded by the middle of the center conductor 65, the upper waveguide wall and the alcove partition 77, and has a typical area of 50 square millimeters. Such a small loop couples effectively only to low impedances. The coupling from the waveguide to the coaxial transmission line would provide a voltage reflection coefficient in the waveguide greater than 0.8 if the coaxial transmission line was terminated in its own characteristic impedance, instead of the electrodeless lamp. A conventional coupling loop for joining the waveguide to the characteristic impedance of a coaxial line, typically 50 Ohms., would have about 10 times more area.

In the preferred embodiment, the bulb has an inside diameter of 6 mm, and is filled with 0.6 mg of sulfur and 150 torr of argon. The power applied is 250 microwave watts, and during operation, the bulb is rotated by motor 66 and stem 67 at speeds in excess of 8000 RPM.

It is noted that while the invention has thus far been described in connection with small bulbs in which problems of the nature discussed tend to be severe, discharges which do not substantially fill the bulb interior can occur in larger bulbs also. The factors which determine the tendency of these effects to occur include the composition of the fill, the fill concentration, the uniformity of the field as determined by the microwave or R.F. excitation structure, the applied power level, the bulb temperature, and the shape of the bulb. It is further noted that rotation results in mixing of the bulb contents, which promotes benefits. Typically, larger bulbs, lower fill concentrations, higher bulb temperatures, and more uniform fields will result in less severe problems, and require lower rotation speeds. For example, it was found that a bulb having a diameter of about two inches which was excited with a relatively uniform field, required a rotation rate of only about three hundred RPM to substantially fill the interior volume of the bulb with the discharge.

In accordance with a further aspect of the invention the wobble or flicker in an electrodeless lamp which emits visible light is eliminated. Such an effect may be due to a perturbation in the bulb envelope such as an eccentricity of shape or other perturbation. Thus, due to manufacturing tolerances, slight eccentricities are common. When light from the lamp is projected by a reflector and/or lens, the resulting wobble effect can be disconcerting to the viewer.

In accordance with the aspect of the invention, it has been found that the wobble effect can be eliminated by rotating the bulb at a fast enough rate.

For the lamp which is described in connection with FIG. 2, it has been found that a rotation rate of 2000–2500 RPM is effective to eliminate wobble. If the light projected by the lamp is magnified, than a higher rate may be necessary.

While the invention has been illustrated in connection with illustrative embodiments, variations will occur to those skilled in the art, and the scope of the invention is to be defined by the claims appended hereto and equivalents.

We claim:

1. An electrodeless lamp, comprising,
   an envelope containing a plasma forming fill which when excited emits light in the form of molecular radiation, said envelope having a diameter of less than ½ inch,
   means for generating electromagnetic energy,
   means for coupling said electromagnetic energy to said fill, which in the absence of envelope rotation or with rotation at an insufficient speed, forms a discharge which does not substantially fill the interior volume of said envelope, and
   means for rotating said envelope at a fast enough rate so as to cause the discharge formed by the fill to substantially fill the interior volume of the envelope.

2. The lamp of claim 1 wherein said discharge which does not substantially fill the interior volume of said envelope is an isolated discharge.

3. The lamp of claim 1 wherein said envelope is visually imperfect, further comprising,
   an optical element comprising a lens and/or reflector arranged in relation to said envelope to project the light which is emitted therefrom, and
   wherein said means for rotating comprises means for rotating the envelope at a fast enough rate to eliminate any wobble effect in the projected light.

4. The lamp of claim 1, wherein the fill comprises at least one of sulfur and selenium as a radiating component which emits principally visible light in the form of molecular radiation.

5. An electrodeless lamp, comprising:
   an envelope containing a plasma forming fill which when excited emits light in the form of molecular radiation, the envelope having a diameter of less than ½ inch;
   a source of electromagnetic energy;
   a coupling structure configured to couple the electromagnetic energy from the source to the fill, wherein in the absence of sufficient rotational speed of the envelope the fill forms a discharge which does not substantially fill an interior volume of the envelope; and
   a motor configured to rotate the envelope at a speed which is sufficient to cause the discharge formed by the fill to substantially fill the interior volume of the envelope.

6. The lamp of claim 5, wherein the discharge which does not substantially fill the interior volume of the envelope is an isolated discharge.

7. The lamp of claim 5, wherein the envelope is visually imperfect, the lamp further comprising:
   an optical element comprising at least one of a lens and a reflector arranged in relation to the envelope to project the light emitted therefrom,
   and wherein the motor is further configured to rotate the envelope at a speed which is sufficient to eliminate a wobble effect in the projected light.

8. The lamp of claim 5, wherein the fill comprises at least one of sulfur and selenium as a radiating component which emits principally visible light in the form of molecular radiation.

9. A method of providing light from an electrodeless lamp, the lamp including an envelope containing a plasma forming fill which when excited emits light in the form of molecular radiation, the envelope having a diameter of less than ½ inch, the method comprising:
   coupling electromagnetic energy to the fill, wherein in the absence of sufficient rotational speed of the envelope the fill forms a discharge which does not substantially fill an interior volume of the discharge; and rotating the envelope at a speed which is sufficient to cause the discharge formed by the fill to substantially fill the interior volume of the envelope.

10. The method of claim 9, wherein the discharge which does not substantially fill the interior volume of the envelope is an isolated discharge.

11. The method of claim 9, wherein the envelope is visually imperfect, further comprising:

projecting the light from the envelope; and rotating the envelope at a speed which is sufficient to eliminate a wobble effect in the projected light.

12. The method of claim 9, wherein the fill comprises at least one of sulfur and selenium as a radiating component which emits principally visible light in the form of molecular radiation.

* * * * *